United States Patent
Ning et al.

(10) Patent No.: US 11,133,185 B2
(45) Date of Patent: Sep. 28, 2021

(54) EPITAXIAL LIFT-OFF PROCESS OF GRAPHENE-BASED GALLIUM NITRIDE

(71) Applicant: XIDIAN UNIVERSITY, Shaanxi (CN)

(72) Inventors: Jing Ning, Shaanxi (CN); Jincheng Zhang, Shaanxi (CN); Dong Wang, Shaanxi (CN); Yanqing Jia, Shaanxi (CN); Chaochao Yan, Shaanxi (CN); Boyu Wang, Shaanxi (CN); Peijun Ma, Shaanxi (CN); Yue Hao, Shaanxi (CN)

(73) Assignee: Xidian University, Xi'an Shaanxi (CN)

( * ) Notice: Subject to any disclaimer, the term of this patent is extended or adjusted under 35 U.S.C. 154(b) by 0 days.

(21) Appl. No.: 16/905,147

(22) Filed: Jun. 18, 2020

(65) Prior Publication Data
US 2020/0402796 A1 Dec. 24, 2020

(30) Foreign Application Priority Data
Jun. 21, 2019 (CN) .......................... 201910544984.2

(51) Int. Cl.
*H01L 21/02* (2006.01)
(52) U.S. Cl.
CPC .... *H01L 21/02499* (2013.01); *H01L 21/0254* (2013.01); *H01L 21/0262* (2013.01); *H01L 21/02444* (2013.01); *H01L 21/02527* (2013.01); *H01L 21/02658* (2013.01); *H01L 21/02664* (2013.01); *H01L 21/02425* (2013.01)

(58) Field of Classification Search
CPC ......... H01L 21/02499; H01L 21/02444; H01L 21/0254; H01L 21/0262; H01L 21/02658; H01L 21/02664; H01L 21/02425
See application file for complete search history.

(56) References Cited

U.S. PATENT DOCUMENTS

2019/0035624 A1* 1/2019 Snure .................. H01L 21/0254

* cited by examiner

*Primary Examiner* — Quoc D Hoang
(74) *Attorney, Agent, or Firm* — Hunton AK, LLP

(57) ABSTRACT

The present invention discloses an epitaxial lift-off process of graphene-based gallium nitride (GaN), and principally solves the existing problems about complex lift-off technique, high cost, and poor quality of lift-off GaN films. The invention is achieved by: first, growing graphene on a well-polished copper foil by CVD method; then, transferring a plurality of layers of graphene onto a sapphire substrate; next, growing GaN epitaxial layer on the sapphire substrate with a plurality of graphene layers transferred by the metal organic chemical vapor deposition (MOCVD) method; finally, lifting off and transferring the GaN epitaxial layer onto a target substrate with a thermal release tape. With graphene, the present invention relieves the stress generated by the lattice mismatch between substrate and epitaxial layer; moreover, the present invention readily lifts off and transfers the epitaxial layer to the target substrate by means of weak Van der Waals forces between epitaxial layer and graphene.

6 Claims, 1 Drawing Sheet

Grow graphene on a copper foil by CVD method

Transfer a plurality of grapheme layers to a substrate

Grow GaN epitaxial layer by MOCVD method

Lift off and transfer the GaN epitaxial layer onto a target substrate

EPITAXIAL LIFT-OFF PROCESS OF GRAPHENE-BASED GALLIUM NITRIDE

The present application relates to and claims priority from Chinese Application No. 201910544984.2 filed on Jun. 21, 2019 and published as Chinese Publication No. CN110265356A on Sep. 20, 2019.

TECHNICAL FIELD

The present invention belongs to the field of microelectronic technology, and further relates to an epitaxial lift-off process of graphene-based gallium nitride. The invention is useful for fabrication of semiconductor devices by transferring gallium nitride onto other substrate.

BACKGROUND

Wide band gap nitride semiconductor materials, as core materials of the third-generation semiconductor industry, have outstanding properties, such as very high photoelectric conversion efficiency, low power consumption, etc. Such materials will be a core foundation of the next generation optoelectronics, power electronics, and high frequency microelectronics in future. Meanwhile, with the development of wearable technology, future flexible semiconductor technology will become the mainstream gradually, and preparation of flexible gallium nitride (GaN) will be a hot spot. Among conventional mainstream processes, all nitride films grow epitaxially on such foreign substrates as sapphire and silicon because large-sized nitride substrates are expensive. However, there is serious lattice mismatch between substrate and nitride. Therefore, AlN is usually used as an insertion layer for epitaxial growth. Graphene is a two-dimensional material consisting of carbon atoms, tightly bound in a hexagonal honeycomb lattice, which is bonded to a nitride by van der Waals forces. With Van der Waals forces between graphene and nitride, nitride film is readily lifted off and transferred to any substrate. In case of transferring onto a flexible substrate, flexible devices can be fabricated. Therefore, lift-off and transfer techniques of GaN are of great importance to the development of flexible devices.

So far, there are usually a plurality of methods for obtaining GaN films. Homoepitaxy of GaN is realized on a free-standing GaN substrate. An advantage of the method is good quality of GaN obtained, and a disadvantage thereof is that the free-standing GaN substrate is expensive. Particularly, the price of a 2-inch free-standing GaN substrate is approximately 10 times that of a SiC substrate of the same size and 100 times that of a Si substrate. GaN grows heteroepitaxially on such substrates as sapphire and SiC. Lift-off process for GaN is generally mechanical grinding. For SiC substrate, the cost thereof is extremely high because the substrate is not reusable after mechanical grinding and is expensive as per. For sapphire, because of high hardness thereof, a large consumption of diamond abrasives will lead to high cost and very slow speed. Alternatively, laser lift-off is used. The principle of the lift-off is that the laser passes through a sapphire substrate and reaches a GaN layer to produce a local explosive blast on the contact surface, resulting in the separation of the GaN therein from the sapphire. Advantages of the laser lift-off process are fast time and recyclable sapphire and substrate, but a disadvantage thereof is that separation of GaN film from the interface by laser lift-off leads to cracking around the GaN film. Therefore, massive, continuous, and undamaged GaN films cannot be available.

SUMMARY

In order to overcome the disadvantages in the prior art, an objective of the present invention is to provide an epitaxial lift-off process of graphene-based gallium nitride (GaN). With weak Van der Waals forces between graphene and epitaxial layer, the invention improves lift-off efficiency and realizes the complete lift-off and transfer of GaN epitaxial layer.

To achieve the above objective, the present invention includes the following steps:

(1) growing graphene on a well-polished copper foil:

(1a) folding a well-polished copper foil into a moderate-sized purse, putting the purse in a quartz boat, pushing the boat to a constant temperature zone in the middle of a quartz tube, and turning on a vacuum pump to vacuumize to 0.6-2 Pa;

(1b) introducing 20-25 sccm $H_2$ into the quartz tube, while heating the quartz tube; introducing both 20-25 sccm $H_2$ and 700-720 sccm Ar into the quartz tube when reaching a temperature of 700° C., and continuing heating until the quartz tube reaches a temperature of 1,045-1,050° C.;

(1c) holding the temperature, closing all inlet valves, and vacuumizing the quartz tube to 0.6-2 Pa with the vacuum pump;

(1d) holding the temperature, introducing 2 sccm O2 into the quartz tube, and maintaining for 2 min;

(1e) holding the temperature, closing all inlet valves, and vacuumizing the quartz tube to around 1 Pa with the vacuum pump;

(1f) holding the temperature, introducing both 100 sccm $H_2$ and 700 sccm Ar, and maintaining for 60 min;

(1g) holding the temperature, closing an Ar gas valve, introducing both 0.1-1 sccm $CH_4$ and 400-600 sccm $H_2$, and maintaining for 60 min; and (1h) maintaining the flow rates of $H_2$ and $CH_4$, rapidly cooling down the quartz tube to room temperature, and removing the graphene grown on the copper foil, which is 0.34 nm thick;

(2) transferring the graphene grown on the copper foil onto a sapphire substrate:

(2a) manually coating a layer of polymethyl methacrylate (PMMA) film on the surface of the graphene-grown copper foil, and spin-coating PMMA uniformly with a spin coater, to obtain a copper foil spin-coated with PMMA;

(2b) placing the copper foil spin-coated with PMMA on a heating stage, setting a temperature thereof at 50-70° C., and drying for 20 min to cure the PMMA film;

(2c) cutting the PMMA-cured copper foil into a plurality of small sheets of equivalent size and soaking in 64-68 g/L ammonium persulfate solution; with a graphene side facing upward, dipping for 4-12 h, and removing a metal substrate, to obtain a plurality of monolayer graphene films with PMMA;

(2d) using a clean glass sheet to transfer a plurality of PMMA/graphene sheets from the ammonium persulfate solution into deionized water; after soaking for 30 min, using a sapphire substrate to pull out one of the small PMMA/monolayer graphene sheets therefrom, to obtain a sapphire substrate coated with PMMA/monolayer graphene;

(2e) adding 100-200 ml of acetone solution into a glass container, and immersing the PMMA/monolayer graphene/substrate thoroughly for 12-24 h to dissolve and remove PMMA fully, to obtain a PMMA-free monolayer graphene/substrate;

(2f) transferring the PMMA-free monolayer graphene/substrate from the acetone solution into an ethanol solution to be allowed to stand for 30 min, pulling out the monolayer graphene/substrate subsequently, and air-drying to complete the transfer of the monolayer graphene; and (2g) using a monolayer graphene-transferred sapphire substrate to pull out a second PMMA/monolayer graphene film, to obtain a substrate coated with PMMA/bilayer graphene; repeating steps (2e) to (2f) to complete the transfer of the second layer of graphene; similarly, pulling out the third to the final PMMA/graphene films to complete the transfer of the third to the final layers of graphene films;

(3) growing GaN epitaxial layer by the metal organic chemical vapor deposition (MOCVD) method:

(3a) placing the graphene-transferred substrate in a reaction chamber and introducing ammonia thereinto; heating the reaction chamber to 900° C., and adjusting the pressure of the reaction chamber to 300 mbar;

(3b) maintaining the reaction chamber at a constant pressure, heating the reaction chamber to a temperature of 1,100° C., and simultaneously introducing $H_2$, ammonia, and Ga source thereinto, where flow rates of the three gases are 800-1,000 sccm, 9,600-10,500 sccm, and 230-260 sccm, respectively; using the MOCVD method, growing 1-3 um GaN on the graphene-transferred substrate; and (3d) removing a sample after cooling down the reaction chamber to room temperature, to obtain GaN grown on the graphene;

(4) lifting off the GaN epitaxial layer:

(4a) slowly adhering a thermal release tape to an upper surface of the GaN epitaxial layer, applying a uniform force to lift the tape having the GaN epitaxial layer adhered thereto off the original substrate completely;

(4b) adhering the GaN-adhered side of the thermal release tape to a target substrate tightly, heating the heating stage to 120° C., subsequently placing the target substrate on the heating stage wholly, and heating for 5 min, where the thermal release tape loses viscosity after foaming and will spontaneously lift off the surface of GaN; and (4c) removing the lift-off tape using tweezers, and leaving the GaN epitaxial layer on the target substrate to realize the lift-off and transfer of the GaN epitaxial layer.

Compared with the prior art, the present invention has the following advantages:

First, the present invention relieves the stress generated by the lattice mismatch between substrate and epitaxial layer and improves the quality of nitride materials, because graphene is transferred on the substrate by wet method, followed by GaN growth.

Second, because the present invention uses graphene as an insertion layer, the epitaxial layer of the present invention can be readily lifted off and transferred to any target substrate by means of weak Van der Waals forces between epitaxial layer and graphene. The present invention realizes the reuse of the original substrate and the cost savings; further, transfer of GaN to a flexible substrate can realize the fabrication of flexible devices and a free-standing GaN substrate.

Third, the present invention uses a thermal release tape for physical lift-off of the transfer of the GaN epitaxial layer. Therefore, compared with such conventional methods as laser lift-off, the present invention is simpler to operate, and reduces both lift-off costs and degree of damage to samples.

DETAILED DESCRIPTION

The implementation of the present invention is further described below with reference to accompanying drawings and examples.

Figure 1:
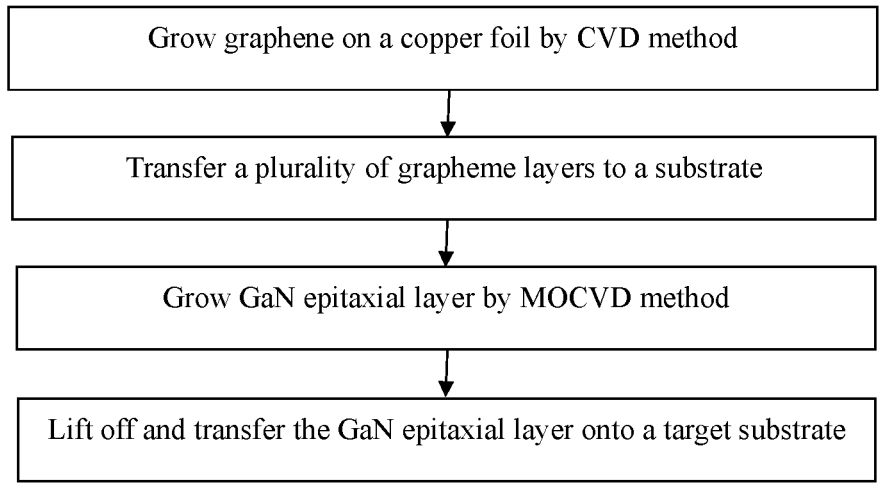
FIG. 1 is a flow chart showing an implementation of the present invention.

Referring to FIG. 1, the present invention gives the following three samples.

Example 1, transferring 1 um thick gallium nitride (GaN) grown on bilayer graphene to a silicon substrate.

Step 1. Growing graphene on a well-polished copper foil by CVD method.

1a) A well-polished copper foil was folded into a moderate-sized purse; the purse was put in a quartz boat; the boat was pushed to a constant temperature zone in the middle of a quartz tube; a vacuum pump was turned on to vacuumize to 1 Pa.

1b) 20 sccm $H_2$ was introduced into the quartz tube, while heating the quartz tube; both 20 sccm $H_2$ and 700 sccm Ar were introduced into the quartz tube when reaching a temperature of 700° C., and heating was continued until the quartz tube reached a temperature of 1,050° C.

1c) The above temperature was held; all inlet valves were closed, and the quartz tube was vacuumized to 1 Pa with the vacuum pump.

1d) The above temperature was held; 2 sccm 02 was introduced into the quartz tube for 2 min.

1e) The above temperature was held; all inlet valves were closed, and the quartz tube was vacuumized to 1 Pa with the vacuum pump.

1f) The above temperature was held; both 100 sccm $H_2$ and 700 sccm Ar were introduced for 60 min.

1g) The above temperature was held; an Ar gas valve was closed, and both 1 sccm $CH_4$ and 500 sccm $H_2$ were introduced for 60 min.

1h) The above flow rates of $H_2$ and $CH_4$ were maintained; the quartz tube was rapidly cooled down to room temperature, and the graphene grown on the copper foil was removed, which was 0.34 nm thick.

Step 2. Transferring the bilayer graphene onto a sapphire substrate.

2a) A layer of polymethyl methacrylate (PMMA) film was manually coated on the surface of the graphene-grown copper foil, and PMMA was spin-coated uniformly with a spin coater. Namely, the rotational speed of the spin coater was set at 1,000 rps for low-speed spinning for 30 s, followed by increasing the rotational speed to 3,000 rps for spinning for 60 s, to obtain a copper foil spin-coated with PMMA.

2b) The copper foil spin-coated with PMMA was placed on a heating stage; a temperature thereof was set at 50° C., followed by drying for 20 min to cure the PMMA film.

2c) The PMMA-cured copper foil was cut into two small sheets of equivalent size and soaked in 64 g/L ammonium persulfate solution; with a graphene side facing upward, after dipping for 8 h, a metal substrate was removed to obtain two monolayer graphene films with PMMA.

2d) A clean glass sheet was used to transfer two PMMA/graphene sheets from the ammonium persulfate solution into deionized water; after soaking for 30 min, a sapphire substrate was used to pull out one of the small PMMA/monolayer graphene sheets therefrom, to obtain a sapphire substrate coated with PMMA/monolayer graphene.

2e) 100 ml of acetone solution was added into a glass container, and the PMMA/monolayer graphene/substrate was immersed thoroughly for 12 h to dissolve and remove PMMA fully, to obtain a PMMA-free monolayer graphene/substrate.

2f) The PMMA-free monolayer graphene/substrate was transferred from the acetone solution into an ethanol solution to be allowed to stand for 30 min; subsequently, the monolayer graphene/substrate was pulled out and air-dried to complete the transfer of the monolayer graphene.

2g) A monolayer graphene-transferred sapphire substrate obtained in step 2d) was used to pull out a second PMMA/monolayer graphene film from the deionized water, to obtain a substrate coated with PMMA/bilayer graphene.

2h) Steps (2e) to (2f) were repeated for the structure obtained in step 2g). The coating PMMA was removed from the graphene to complete the transfer of the second layer of graphene, to obtain a bilayer graphene-transferred sapphire substrate.

Step 3. Growing 1 um GaN on the bilayer graphene/sapphire substrate.

3a) The graphene-transferred sapphire substrate was placed in a reaction chamber and ammonia was introduced thereinto; the reaction chamber was heated to 900° C., and the pressure of the reaction chamber was adjusted to 300 mbar.

3b) The reaction chamber was maintained at a constant pressure; the reaction chamber was heated to a temperature of 1,100° C., and simultaneously, $H_2$, ammonia, and Ga source were introduced thereinto, where flow rates of the three gases were 900 sccm, 9,600 sccm, and 250 sccm, respectively; using the MOCVD method, 1 um GaN was obtained by growing on the graphene-transferred substrate for 35 min.

Figure 2:
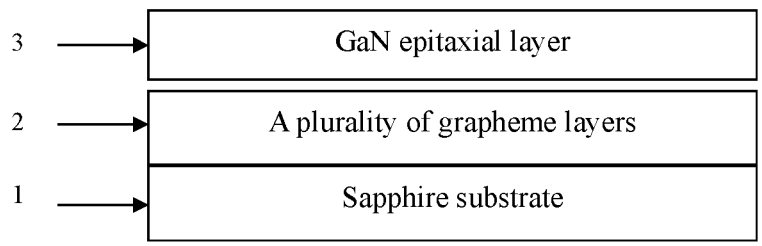
FIG. 2 illustrates the profile structure of a material before lift-off and transfer in the present invention.

3d) A sample was removed after cooling down the reaction chamber to room temperature, to obtain 1 um GaN grown on the bilayer graphene, as shown in FIG. 2.

Step 4. Transferring the 1 um GaN film onto a silicon substrate.

4a) A thermal release tape was slowly adhered to an upper surface of the GaN epitaxial layer; a uniform force was applied to lift the tape having the GaN epitaxial layer adhered thereto off the original substrate completely.

4b) The GaN-adhered side of the thermal release tape was adhered to a silicon substrate tightly, the heating stage was heated to 120° C.; subsequently, the target substrate was placed on the heating stage wholly, and heated for 5 min; thereafter, the thermal release tape spontaneously lifted off the surface of GaN once the tape lost viscosity thereof after foaming.

Figure 3:
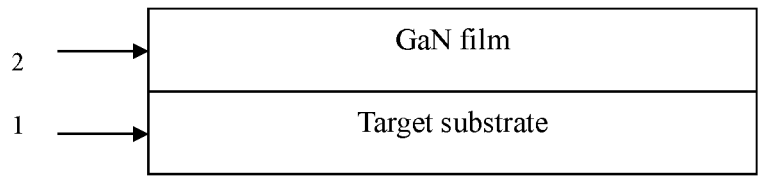
FIG. 3 illustrates the profile structure of a material after lift-off and transfer in the present invention.

4c) The lift-off tape was removed with tweezers, and the GaN epitaxial layer was left on the silicon substrate to realize the lift-off and transfer of the GaN epitaxial layer, as shown in FIG. 3.

Example 2, transferring 2 um GaN grown on four-layer graphene to a flexible PET substrate.

Step A. Growing graphene on a copper foil by CVD method.

The specific implementation of the step is the same as that in Example 1.

Step B. Transferring the four-layer graphene to a sapphire substrate.

B1) Spin-coating and curing PMMA on the surface of the graphene-grown copper foil:

The specific implementation of the step is the same as that in steps 2a) to 2b) of Example 1.

B2) The PMMA-cured copper foil was cut into four small sheets of equivalent size and soaked in 64 g/L ammonium persulfate solution; with a graphene side facing upward, after dipping for 8 h, a metal substrate was removed to obtain four monolayer graphene films with PMMA.

B3) Transferring monolayer graphene onto the sapphire substrate and dissolving PMMA:

The specific implementation of the step is the same as that in steps 2d) to 20 of Example 1.

B4) A monolayer graphene-transferred sapphire substrate was used to pull out a second PMMA/monolayer graphene film, to obtain a substrate coated with PMMA/bilayer graphene. Step B3) was repeated and transfer of the second layer of graphene was completed to obtain a bilayer graphene-transferred sapphire substrate. Subsequently, the bilayer graphene-transferred sapphire substrate was used to pull out a third layer of graphene; a three-layer graphene-transferred sapphire substrate was used to pull out a fourth layer of graphene, to obtain a four-layer graphene-transferred sapphire substrate.

Step C. Growing 2 um GaN on the four-layer graphene/sapphire substrate.

C1) The graphene-transferred sapphire substrate was placed in a reaction chamber and ammonia was introduced thereinto; the reaction chamber was heated to 900° C., and the pressure of the reaction chamber was adjusted to 300 mbar.

C2) The reaction chamber was maintained at a constant pressure; the reaction chamber was heated to a temperature of 1,100° C., and simultaneously, $H_2$, ammonia, and Ga source were introduced thereinto, where flow rates of the three gases were 900 sccm, 9,600 sccm, and 250 sccm, respectively; using the MOCVD method, 2 um GaN was obtained by growing on the graphene-transferred substrate for 70 min.

C3) A sample was removed after cooling down the reaction chamber to room temperature, to obtain 2 um GaN grown on the bilayer graphene, as shown in FIG. 2.

Step D. Transferring the 2 um GaN film onto a flexible PET substrate.

D1) A thermal release tape was slowly adhered to an upper surface of the GaN epitaxial layer; a uniform force was applied to lift the tape having the GaN epitaxial layer adhered thereto off the original substrate completely.

D2) The GaN-adhered side of the thermal release tape was adhered to a flexible PET substrate tightly, the heating stage was heated to 120° C.; subsequently, the target substrate was placed on the heating stage wholly, and heated for 5 min; thereafter, the thermal release tape spontaneously lifted off the surface of GaN once the tape lost viscosity thereof after foaming.

D3) The lift-off tape was removed with tweezers, and the GaN epitaxial layer was left on the flexible PET substrate to realize the lift-off and transfer of the GaN epitaxial layer, as shown in FIG. 3.

Example 3, transferring 3 um GaN grown on six-layer graphene onto a diamond substrate.

Step 1. Growing graphene on a copper foil by CVD method:

The specific implementation of the step is the same as that in Example 1.

Step 2. Transferring six-layer graphene onto a sapphire substrate 2.1) Spin-coating and curing PMMA on the surface of the graphene-grown copper foil:

The specific implementation of the step is the same as that in steps 2a) to 2b) of Example 1.

2.2) The PMMA-cured copper foil was cut into six small sheets of equivalent size and soaked in 64 g/L ammonium persulfate solution; with a graphene side facing upward, after dipping for 8 h, a metal substrate was removed to obtain six monolayer graphene films with PMMA.

2.3) Transferring monolayer graphene onto the sapphire substrate and dissolving PMMA:

The specific implementation of the step is the same as that in steps 2d) to 20 of Example 1.

2.4) A monolayer graphene-transferred sapphire substrate was used to pull out a second PMMA/monolayer graphene film, to obtain a substrate coated with PMMA/bilayer graphene. Step 2.3) was repeated and transfer of the second layer of graphene was completed to obtain a bilayer graphene-transferred sapphire substrate. Subsequently, the bilayer graphene-transferred sapphire substrate was used to pull out a third layer of graphene; a three-layer graphene-transferred sapphire substrate was used to pull out a fourth layer of graphene; a four-layer graphene-transferred sapphire substrate was used to pull out a fifth layer of graphene; a five-layer graphene-transferred sapphire substrate was used to pull out a sixth layer of graphene, to obtain a six-layer graphene-transferred sapphire substrate.

Step 3. Growing 3 um GaN on the six-layer graphene/sapphire substrate.

3.1) The graphene-transferred sapphire substrate was placed in a reaction chamber and ammonia was introduced thereinto; the reaction chamber was heated to 900° C., and the pressure of the reaction chamber was adjusted to 300 mbar.

3.2) The reaction chamber was maintained at a constant pressure; the reaction chamber was heated to a temperature of 1,100° C., and simultaneously, $H_2$, ammonia, and Ga source were introduced thereinto, where flow rates of the three gases were 900 sccm, 9,600 sccm, and 250 sccm, respectively; using the MOCVD method, 3 um GaN was obtained by growing on the graphene-transferred substrate for 105 min.

3.3) A sample was removed after cooling down the reaction chamber to room temperature, to obtain 3 um GaN grown on the six-layer graphene, as shown in FIG. 2.

Step 4. Transferring the 3 um GaN film onto a diamond substrate.

4.1) A thermal release tape was slowly adhered to an upper surface of the GaN epitaxial layer; a uniform force was applied to lift the tape having the GaN epitaxial layer adhered thereto off the original substrate completely.

4.2) The GaN-adhered side of the thermal release tape was adhered to a diamond substrate tightly, the heating stage was heated to 120° C.; subsequently, the target substrate was placed on the heating stage wholly, and heated for 5 min; thereafter, the thermal release tape spontaneously lifted off the surface of GaN once the tape lost viscosity thereof after foaming.

4.3) The lift-off tape was removed with tweezers, and the GaN epitaxial layer was left on the diamond substrate to realize the lift-off and transfer of the GaN epitaxial layer, as shown in FIG. 3.

The foregoing descriptions are merely three examples of the present invention and not meant to limit the scope of the invention. It will be apparent to those skilled in the art that changes and modifications may be made within the scope of the invention without departing from the spirit and structure of the invention, but all of these changes and modifications based on the idea of the invention still fall within the scope of the claims of the invention.

What is claimed is:

1. An epitaxial lift-off process for graphene-based gallium nitride (GaN), comprising the following steps:

(1) growing graphene on a well-polished copper foil:

(1a) folding a well-polished copper foil into a moderate-sized purse, putting the purse in a quartz boat, pushing the boat to a constant temperature zone in the middle of a quartz tube, and turning on a vacuum pump to vacuumize to 0.6-2 Pa;

(1b) introducing 20-25 sccm $H_2$ into the quartz tube, while heating the quartz tube; introducing both 20-25 sccm $H_2$ and 700-720 sccm Ar into the quartz tube when reaching a temperature of 700° C., and continuing heating until the quartz tube reaches a temperature of 1,045-1,050° C.;

(1c) holding the temperature, closing all inlet valves, and vacuumizing the quartz tube to 0.6-2 Pa with the vacuum pump;

(1d) holding the temperature, introducing 2 sccm O2 into the quartz tube, and maintaining for 2 min;

(1e) holding the temperature, closing all inlet valves, and vacuumizing the quartz tube to around 1 Pa with the vacuum pump;

(1f) holding the temperature, introducing both 100 sccm $H_2$ and 700 sccm Ar, and maintaining for 60 min;

(1g) holding the temperature, closing an Ar gas valve, introducing both 0.1-1 sccm $CH_4$ and 400-600 sccm $H_2$, and maintaining for 60 min; and (1h) maintaining the flow rates of $H_2$ and $CH_4$, rapidly cooling down the quartz tube to room temperature, and removing the graphene grown on the copper foil, which is 0.34 nm thick;

(2) transferring the graphene grown on the copper foil onto a sapphire substrate:

(2a) manually coating a layer of polymethyl methacrylate (PMMA) film on the surface of the graphene-grown copper foil, and spin-coating PMMA uniformly with a spin coater, to obtain a copper foil spin-coated with PMMA;

(2b) placing the copper foil spin-coated with PMMA on a heating stage, setting a temperature thereof at 50-70° C., and drying for 20 min to cure the PMMA film;

(2c) cutting the PMMA-cured copper foil into a plurality of small sheets of equivalent size and soaking in 64-68 g/L ammonium persulfate solution; with a graphene side facing upward, dipping for 4-12 h, and removing a metal substrate, to obtain a plurality of monolayer graphene films with PMMA;

(2d) using a clean glass sheet to transfer a plurality of PMMA/graphene sheets from the ammonium persulfate solution into deionized water; after soaking for 30 min, using a sapphire substrate to pull out one of the small PMMA/monolayer graphene sheets therefrom, to obtain a sapphire substrate coated with PMMA/monolayer graphene;

(2e) adding 100-200 ml of acetone solution into a glass container, and immersing the PMMA/monolayer graphene/substrate thoroughly for 12-24 h to dissolve and remove PMMA fully, to obtain a PMMA-free monolayer graphene/substrate;

(2f) transferring the PMMA-free monolayer graphene/substrate from the acetone solution into an ethanol solution to be allowed to stand for 30 min, pulling out the monolayer graphene/substrate subsequently, and air-drying to complete the transfer of the monolayer graphene; and (2g) using a monolayer graphene-transferred sapphire substrate to pull out a second PMMA/monolayer graphene film, to obtain a substrate coated with PMMA/bilayer graphene; repeating steps (2e) to (20 to complete the transfer of the second layer of graphene; similarly, pulling out the third to the final PMMA/graphene films to complete the transfer of the third to the final layers of graphene films;

(3) growing GaN epitaxial layer by the metal organic chemical vapor deposition (MOCVD) method (3a) placing the graphene-transferred substrate in a reaction chamber and introducing ammonia thereinto; heating the reaction chamber to 900° C., and adjusting the pressure of the reaction chamber to 300 mbar;

(3b) maintaining the reaction chamber at a constant pressure, heating the reaction chamber to a temperature of 1,100° C., and simultaneously introducing $H_2$, ammonia, and Ga source thereinto, wherein flow rates of the three gases are 800-1,000 sccm, 9,600-10,500 sccm, and 230-260 sccm, respectively; using the MOCVD method, growing 1-3 um GaN on the graphene-transferred substrate; and (3d) removing a sample after cooling down the reaction chamber to room temperature, to obtain GaN grown on the graphene;

(4) lifting off the GaN epitaxial layer:

(4a) slowly adhering a thermal release tape to an upper surface of the GaN epitaxial layer, applying a uniform force to lift the tape having the GaN epitaxial layer adhered thereto off the original substrate completely;

(4b) adhering the GaN-adhered side of the thermal release tape to a target substrate tightly, heating the heating stage to 120° C., subsequently placing the target substrate on the heating stage wholly, and heating for 5 min, wherein, the thermal release tape loses viscosity after foaming and will spontaneously lift off the surface of GaN; and (4c) removing the lift-off tape using tweezers, and leaving the GaN epitaxial layer on the target substrate to realize the lift-off and transfer of the GaN epitaxial layer.

2. The process according to claim 1, wherein spin-coating PMMA uniformly with the spin coater in step (2a) is realized by adjusting the rotational speed of the spin coater, i.e., setting the rotational speed of the spin coater at 1,000 rps for low-speed spinning for 30 s, followed by increasing the rotational speed to 3,000 rps for spinning for 60 s.

3. The process according to claim 1, wherein 2 to 6 graphene sheets are cut in step (2c).

4. The process according to claim 1, wherein the sapphire substrate in step (2d) is 0.43-0.5 mm thick.

5. The process according to claim 1, wherein 2 to 6 graphene layers are transferred in step (2g).

6. The process according to claim 1, wherein the target substrate in step (4b) may be any one of silicon substrate, flexible PET substrate, and diamond substrate.

* * * * *